United States Patent [19]

Hsieh

[11] 4,142,924
[45] Mar. 6, 1979

[54] FAST-SWEEP GROWTH METHOD FOR GROWING LAYERS USING LIQUID PHASE EPITAXY

[75] Inventor: Jaw J. Hsieh, Burlington, Mass.

[73] Assignee: Massachusetts Institute of Technology, Cambridge, Mass.

[21] Appl. No.: 751,518

[22] Filed: Dec. 16, 1976

[51] Int. Cl.² ............................................. H01L 21/208
[52] U.S. Cl. ..................................... 148/171; 148/172; 427/87
[58] Field of Search .................... 148/171, 172; 427/87

[56] References Cited

U.S. PATENT DOCUMENTS

| 3,950,195 | 4/1976 | Rode et al. | 148/171 |
| 3,981,764 | 9/1976 | Ito et al. | 156/622 |

Primary Examiner—G. Ozaki
Attorney, Agent, or Firm—Arthur A. Smith, Jr.; Martin M. Santa

[57] ABSTRACT

A uniform and thin layer of a semiconductor is grown on a semiconductor substrate by an improved liquid phase epitaxy growth method. The growth solution is supercooled and is pushed rapidly over the substrate on which the layer of solute is grown. In GaAs the amount of supercooling is typically 3° to 5° C. and a constant thickness ultra-thin layer (about 0.18 microns) is grown on top of a GaAs substrate.

9 Claims, 3 Drawing Figures

FAST-SWEEP GROWTH METHOD FOR GROWING LAYERS USING LIQUID PHASE EPITAXY

The Government has rights in this invention pursuant to Contract No. AF19(628)-76-C-0002 awarded by the Department of the Air Force.

BACKGROUND OF THE INVENTION

This invention relates to crystal growth and more particularly to a method of liquid phase epitaxial growth of thin uniform layers.

The great majority of the multiple GaAs and $Ga_{1-x}Al_xAs$ layers used to form double-heterostructure (DH) diode lasers are grown by liquid phase epitaxy (LPE). In particular, they are prepared by the technique of equilibrium cooling, in which a Ga-rich growth solution saturated with As is placed in contact with a substrate wafer for a specified time while the system is being cooled at a uniform rate. The development of this technique has made it possible to grow smooth layers of uniform thickness (well below 1μm, for the GaAs active layer) with controlled impurity concentration but not with reproducible thickness.

Even smoother LPE layers can be obtained if the growth solution is supercooled by about 5° C. before being placed in contact with the substrate, as reported in a paper by the inventor in the Journal of Crystal Growth 27 (1974) 49–61. There are two different cases of this type, depending on whether the system temperature is reduced during the time of substrate-solution contact (supercooling technique) or is kept constant (step-cooling technique). It was shown experimentally that the thickness of the layers grown by both techniques, as well as by the equilibrium-cooling technique, was determined under the usual growth conditions by the amount of As that diffuses out of the growth solution to the substrate-solution interface.

These prior art methods of LPE crystal growth use a liquidus which is in equilibrium with the substrate on which the thin layer was to be grown. The growth is in the region where the growth mechanism is a diffusion limited process. Therefore, the layer thickness depends strongly on the growth time and is in fact proportioned to the three halves power of time for equilibrium-growth and to the half power of time for step-cooling growth. Reproducible growth of an LPE layer under equilibrium condition requires tight control of the growth parameters such as growth time, the exact solution temperature (to obtain equilibrium) and furnace temperature profile.

The disadvantage of these prior-art methods of growth is that the layer thickness cannot be controlled reproducibly. This lack of control not only affects the device performance because of the variation in layer thickness and the yield of useful devices is markedly reduced. In addition, these prior-art growth processes usually take a much longer time to grow the desired layer than in the method of the invention.

If it is desired to grow a thin (in the order of one-tenth micron) layer by the prior art methods, the growth solution was usually prepared to be in the equilibrium condition (i.e., the amount of supercooling of the growth solution is approximately 0° C.). The time required for the growth was long; and if the solution was not actually in equilibrium or if the growth time was not properly controlled, layers of different thickness would result.

It is therefore the primary object of this invention to grow thin epitaxial layers which are highly reproducible.

It is a further object of this invention to provide a method of reproducibly growing a thin LPE layer on a substrate without tight control of the growth parameters such as growth time, exact solution temperature and furnace profile which are critical to the prior-art methods.

It is a further object of this invention to provide a method for growing a thin active layer in double-heterojunction laser diodes which will give low threshold current density and extended life time of the diodes containing such thin active layer.

It is a further object of this invention to grow films which have good surface morphology in addition to being thin and of uniform thickness.

It is a feature of this invention that these thin layers have high growth ratio which contributes to the extended lifetime of double-heterojunction laser diodes made with these thin layers.

Other objects and features of this invention will become apparent from the following description of the invention read in conjunction with the figures in which.

SUMMARY OF THE INVENTION

The growth solution is supercooled and is pushed rapidly over the substrate on which the layer of solute is grown. In GaAs the amount of supercooling is typically 3° to 5° C. and a constant ultra-thin layer (about 0.18 microns) is grown on top of a GaAs substrate. It is believed that uniformity of layer thickness is obtained despite variation in supercooling and growth time because the short contact time between the supersaturated solution and the substrate minimizes diffusion effects, and that the layer thickness is determined by the As which contacts the substrate as the growth solution moves across the substrate.

DETAILED DESCRIPTION OF THE INVENTION

Figure 1:
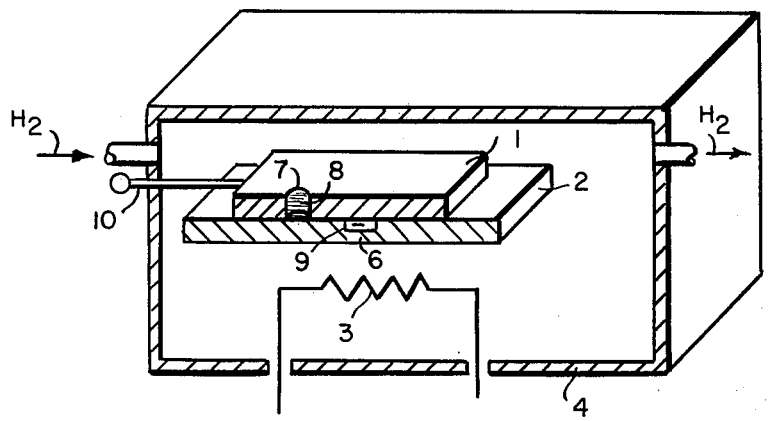
FIG. 1 shows a cross-sectional perspective view for growing a layer on a substrate by the liquid phase epitaxy method of this invention.

The general procedure used for LPE growth is well-known and the usual apparatus is shown in cross section in FIG. 1. Growth is carried out under flowing $H_2$ in a horizontal sliding high-purity-graphite boat 1,2 inside a resistance 3 heated furnace 4. The substrate 6 is a GaAs wafer oriented either (100) or 2° off (100) but the orientation is not critical. The upper portion 1 of the boat has at least one well 7 containing the supersaturated solution 8 of GaAs. The lower portion 2 of the boat has at least one cavity 9 containing a GaAs substrate 6. The substrate 6 fills the cavity so completely that the surface tension of the solution 8 is sufficient to remove all the solution except for that which is deposited on the substrate in the form of GaAs by the passage of the solution over the substrate. A rod 10 attached to the upper portion of the boat extends through the furnace 4 wall and allows the upper portion to be pushed or pulled to cause the solution 8 to pass over and in contact with the substrate 6. The rod was typically moved at a velocity of ten to twenty inches per sec without substantial change in the thickness of the layer formed on the 1.1 cm$^2$ substrate, and the growth or contact time was therefore 0.05 to 0.1 sec.

The solution, which is a mixture of Ga and GaAs has an equilibrium temperature which is predetermined by either knowing the ratio of Ga to As in the solution or by removing any undissolved GaAs from a solution of Ga and As at that temperature. The solution and the substrate in the oven have their temperatures raised substantially above the equilibrium temperature, typically by 50° C., to be certain that any small crystals of GaAs are dissolved into solution. (The GaAs substrate has a higher melting point than the solution and hence does not melt.) The solution and substrate are then cooled in the oven to a temperature below the solution equilibrium temperature to be in a supercooled state. Cooling is typically at a rate of 0.6° C. per minute although the rate is not critical. The substrate of GaAs, which is at the same temperature as the growth solution, can then make contact with the solution as described in the preceding paragraph to grow a thin layer of GaAs on the GaAs substrate.

An alternate supercooling technique to use with the fast growth method of this invention is to keep the solution at a temperature from which it can be supercooled and the substrate is maintained at a different temperature lower than the solution temperature. The substrate is brought into contact with the solution as in this invention and a very thin layer is grown on the substrate surface.

Dopants can be added to the solution as in conventional LPE growth methods to dope the grown layers to be either p- or n-type. For example, Zn, Cd, etc. can be added in the Ga-GaAs solution to dope the grown GaAs layer p-type to a specific concentration; or Ge, Sn, S, Se, etc. can be added to the Ga-GaAs solution to dope the grown GaAs layers n-type.

Figure 2:
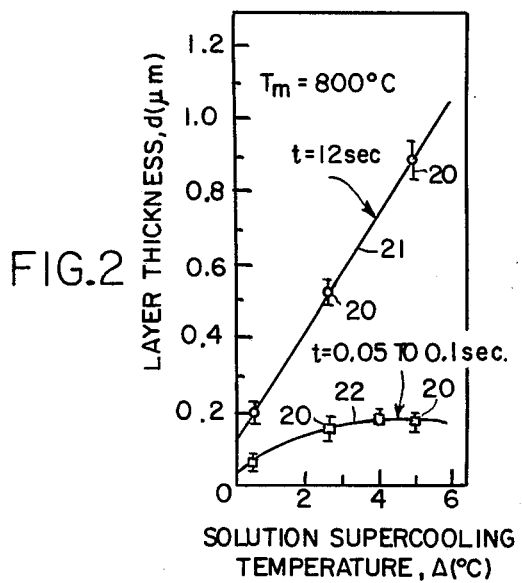
FIG. 2 shows the variation of layer thickness as a function of solution supercooling for two different growth times.

FIG. 2 shows the thickness of GaAs layers grown by the supercooling technique as a function of the amount of supercooling ($\Delta$) of the growth solution for two values of growth time. The maximum and minimum values of thickness for each layer are indicated by error bars 20. In all cases, the solution and substrate were placed in contact at 800° C. When the solution and substrate were kept in contact for 12 sec as in the prior art, the thickness is seen, curve 21, to increase linearly with $\Delta$, as expected for diffusion-controlled growth.

Although the layer thicknesses plotted in FIG. 2 were grown at 800° C. and equilibrium temperature in the range 803°–805° C., other temperatures can be used to grow layers of different thickness. Also, for different compound semiconductors the growth temperature and the amount of supercooling temperature may also be varied to suit specific need and growth conditions. For example, InP thin layers were grown at 630° C. with about 10° C. supercooling.

Curve 22 of FIG. 2 shows thicknesses obtained when the growth solution was pushed rapidly over the substrate without stopping, in accordance with the method of this invention. The push rate was 10 to 20 cm/sec, so that the time of contact between the solution and substrate was only 0.05 to 0.1 sec. All the layers grown in this way were extremely smooth and flat. In these experiments, the value of thickness initially increased as $\Delta$ increased but soon reached a limiting value of about 0.18 $\mu$m for $\Delta$ greater than 3° C., as shown by curve 22. This result indicates that growth by the fast-push technique is not diffusion-controlled. This conclusion is confirmed by the date shown in FIG. 3 where thickness and the growth rate are plotted on curves 30, 31, respectively, as a function of growth time for GaAs layers grown by the supercooling technique at 800° C. with $\Delta$ = 5° C. At values of growth time approaching 100 sec, the measured values of thickness and rate of growth are in good agreement with those calculated (dashed line curves 32, 33, respectively) for diffusion-controlled growth. At shorter times, however, thickness is significantly higher than the diffusion-controlled values, and for the growth time obtained with the fast-push technique, thickness hardly depends on growth time.

The mechanism by which the fast growth of the epitaxial layers is obtained is uncertain but is believed to be as follows. When the supercooled solution is in contact with the substrate, the excess solute (e.g., GaAs in Ga-GaAs solution) near the solution-substrate interface is pulled to the substrate surface and deposited on it. This mechanism obviously is much faster than the diffusion process. In addition the solution near the solution-substrate interface is constantly under a stirring motion because of the movement of the solution in the push step. This turbulence tends to replenish the solution with the solute away from the solution-substrate interface and makes the deposition of a uniformly thin layer over a large area possible.

Figure 3:
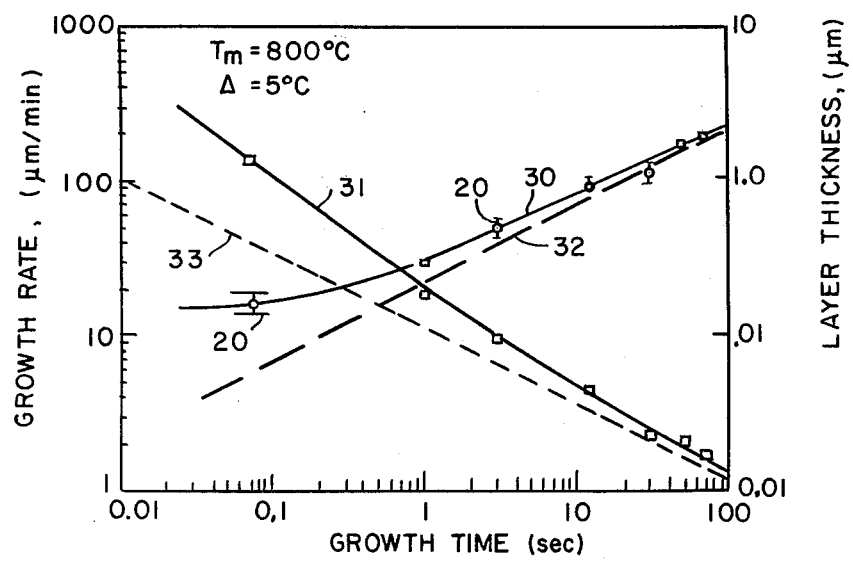
FIG. 3 shows the growth rate and layer thickness for a specific amount of supercooling as a function of growth time.

The data of FIGS. 2 and 3 indicate that layers of reproducible thickness are obtained readily by the method of this invention. Furthermore, it is seen in FIG. 3 that the growth rate obtained by fast pushing exceeds 100 $\mu$m/min (computed by assuming a growth time of 0.075 sec). High growth rates are found to increase the lifetime of lasers significantly. To achieve growth rates this high by equilibrium cooling would require cooling rates of the order of 100° C./min.

To facilitate measurement of the GaAs layer thickness, a layer of Ga$_{0.67}$Al$_{0.33}$As was first grown on the substrate, followed by the test layer of GaAs. A portion of the GaAs was removed by using a selective superoxol etchant, which etches GaAs about 40 times faster than Ga$_{0.67}$Al$_{0.33}$As. The GaAs layer thickness then was measured by using a two-beam interference microscope to determine the difference in height between the as-grown GaAs surface and the Ga$_{0.67}$Al$_{0.33}$As surface exposed by etching.

The reproducibility of growth by the fast-push technique has been demonstrated by a series of experiments in which this method was used to grow the active layers for double heterojunction laser diodes on six GaAs substrates. In each run, the growth temperature was 800° C. and $\Delta$ was 5° C. The thickness values, which were measured with a scanning electron microscope after the wafers have been cleaved and etched with superoxol, were 0.099, 0.101, 0.137, 0.109, and 0.092 $\mu$m, and the thickness of each layer was uniform to within $\pm$ 5 percent. (The systematic difference of about 0.08 $\mu$m between these values and the thickness of 0.18 $\mu$m obtained for growth of GaAs on Ga$_{0.67}$Al$_{0.33}$As in a single heterostructure configuration is due to the partial dissolution of the active layer during the growth of the second Ga$_{0.67}$Al$_{0.33}$As barrier layer for the double heterojunction. This was confirmed by an experiment in which the active layer thickness was measured before and after the growth of the second barrier layer. The reduction in thickness was found to be 0.088 μm.)

The superiority of laser performance when made according to the invention was measured by the threshold current density, $J_{th}$, at room-temperature. Lasers consistently had $J_{th}$ values between 0.86–1.30 ka/cm² which compares favorably with the best double heterojunction lasers reported in the literature.

Although the invention has been described in detail, using as an example the growth of a GaAs layer on a GaAs or a $Ga_{0.67}Al_{0.33}As$ substrate, the invention should not be so limited. The method of this invention may be used to grow layers of III–V compounds from III and V solutions on the same or a different III–V substrate. In particular, layers of InAs, InSb, GaSb, InP, and GaP may be grown on substrates of these materials. In addition, ternary and quaternary compounds, for example, $Ga_xAl_{(1-x)}As$ $Ga_xIn_{(1-x)}P$ layers may be grown on GaAs and $Ga_xIn_{(1-x)}As_yP_{(1-y)}$ layers may be grown on InP and vice versa. Ternary and quaternary compounds of the other III–V compounds may also be used in this invention. The necessary condition is that the solution from which a compound is to be grown must be capable of being placed in ths supercooled state.

There are numerous devices that require the growth of one or more ultra-thin layers, such as in the fabrication on GaAs or InP FET'S (field effect transistors), GaAs/GaAlAs double heterostructure (DH) diode lasers, GaAlAs/GaAs solar cells, GaAs varactors, impatt diodes, etc. Therefore, ultra-thin layers are easily obtained. Because of the fast growth rate of this ultra-thin layer, the lifetime of the DH diode lasers can be improved significantly if the active layer of the DH lasers is grown by this invented method.

While the particular embodiment of the invention specifically discussed above seems preferable at the present time, modification thereto may occur to those skilled in the art without departing from the spirit and scope of the invention. Hence, the invention is not to be construed as limited to the particular embodiment shown and described herein, except as defined by the appended claims.

What is claimed is:

1. A liquid phase epitaxy method for growing a thin film of a first semiconductor on a second semiconductor substrate comprising:
    supercooling a solution comprising the compound of said first semiconductor to a temperature below the equilibrium temperature of said solution,
    heating said substrate to the temperature of said supercooled solution,
    sliding said solution over and in contact with said substrate at a speed where the growth time during which they are in contact is such that growth of the film by mechanical convection of the solution-substrate interface caused by sliding the solution over and in contact with the substrate dominates that growth of the film which occurs by the diffusion mechanism during the time that the solution is in contact with the substrate,
    whereby an ultra-thin layer of said first semiconductor compound from the solution is formed on said second semiconductor substrate during said growth time.

2. A liquid phase epitaxy method for growing a thin film of a first semiconductor on a second semiconductor substrate comprising:
    heating a solution comprising the compound of said first semiconductor to a temperature which is at least as high as the equilibrium temperature,
    heating a substrate to a lower temperature than equilibrium temperature,
    sliding said solution over and in contact with said substrate at a speed where the growth time during which they are in contact is such that growth of the film by mechanical convection of the solution-substrate interface caused by sliding the solution over and in contact with the substrate dominates that growth of the film which occurs by the diffusion mechanism during the time that the solution is in contact with the substrate,
    whereby an ultra-thin layer of said first semiconductor compound from the solution is formed on said second semiconductor substrate during said growth time.

3. A liquid phase epitaxy method for growing a thin film of a first semiconductor on a second semiconductor substrate comprising:
    heating said substrate and a solution comprising the compound of said first semiconductor to a temperature higher then the equilibrium temperature of the solution,
    cooling said substrate and said solution to a temperature below the equilibrium temperature of the solution,
    sliding said solution over and in contact with said substrate at a speed where the growth time during which they are in contact is such that growth of the film by mechanical convection of the solution-substrate interface caused by sliding the solution over and in contact with the substrate dominates that growth of the film which occurs by the diffusion mechanism during the time that the solution is in contact with the substrate,
    whereby an ultra-thin layer of said first semiconductor compound from the solution is formed on said second semiconductor substrate during said growth time.

4. The method of claim 3 wherein:
    said solution comprises group III and V elements of the periodic table and the substrate comprises a III–V compound.

5. The method of claim 4 wherein:
    said group III elements are selected from the group consisting of In and Ga, and
    said group V elements are selected from the group consisting of As, P, Sb.

6. The method of claim 4 wherein:
    said solution comprises Ga and GaAs, and
    said substrate comprises GaAs.

7. The method of claim 4 wherein:
    said solution and said substrate have doping elements added to make them of opposite conductivity types.

8. The method of claim 4 wherein:
    said solution and said substrate comprise at least one of the group III and at least one of the group V elements.

9. The method of claim 3 wherein:
    said solution comprises Ga and GaAs whose equilibrium temperature range is 803° to 805° C.,
    said substrate comprises GaAs,
    said supercooling temperature is the range of 3° to 5° C.,
    the growth time is in the range of 0.05 to 0.1 sec, and
    the growth temperature is 800° C.

* * * * *